United States Patent
Bow et al.

(10) Patent No.: US 10,444,643 B2
(45) Date of Patent: Oct. 15, 2019

(54) LITHOGRAPHIC THERMAL DISTORTION COMPENSATION WITH THE USE OF MACHINE LEARNING

(71) Applicant: NIKON RESEARCH CORPORATION OF AMERICA, Belmont, CA (US)

(72) Inventors: Travis Bow, Belmont, CA (US); Fardad Hashemi, Moraga, CA (US); Henry Kin Heng Pang, Foster City, CA (US)

(73) Assignee: Nikon Research Corporation of America, Belmont, CA (US)

( * ) Notice: Subject to any disclaimer, the term of this patent is extended or adjusted under 35 U.S.C. 154(b) by 0 days.

(21) Appl. No.: 15/935,555

(22) Filed: Mar. 26, 2018

(65) Prior Publication Data

US 2018/0275525 A1  Sep. 27, 2018

Related U.S. Application Data

(60) Provisional application No. 62/476,278, filed on Mar. 24, 2017.

(51) Int. Cl.
G03F 7/20 (2006.01)

(52) U.S. Cl.
CPC ............ G03F 7/7085 (2013.01); G03F 7/705 (2013.01); G03F 7/70516 (2013.01); G03F 7/70725 (2013.01); G03F 7/70775 (2013.01); G03F 7/70858 (2013.01); G03F 7/70891 (2013.01)

(58) Field of Classification Search
CPC .. G03F 7/705; G03F 7/70516; G03F 7/70725; G03F 7/70775; G03F 7/7085; G03F 7/70858; G03F 7/70891

USPC ......................................... 355/30, 53, 72, 77
See application file for complete search history.

(56) References Cited

U.S. PATENT DOCUMENTS

| | | |
|---|---|---|
| 6,738,722 B2 | 5/2004 | Polla et al. |
| 7,151,588 B2 | 12/2006 | Franken et al. |
| 2010/0214338 A1 | 8/2010 | Brookmire et al. |

FOREIGN PATENT DOCUMENTS

| | | |
|---|---|---|
| CN | 1868666 A | 11/2006 |
| CN | 101797704 A | 8/2010 |
| JP | H08215982 A | 8/1996 |
| WO | 2012082543 A2 | 6/2012 |
| WO | 2015024783 A1 | 2/2015 |

*Primary Examiner* — Colin W Kreutzer
(74) *Attorney, Agent, or Firm* — Van Pelt, Yi & James LLP

(57) ABSTRACT

Lithographic exposure tool and method for operating thereof that includes modification of the tool (assessed based on the measurements of geometrical distortions caused, in the tool, by the exposure process and used to train the exposure tool) to ensure that such geometrical distortions are reduced for any chosen exposure process. The method includes processing first data (representing distortions caused by initial exposure run(s)) to estimate second data representing distortions that would occur for another exposure run); and forming a modified exposure tool by changing at least one of a) a geometrical path is a path along which the workpiece stage is repositioned during the operation of the exposure tool; b) one or more of a presence, position, orientation, size and shape of an optical component of an optical projection sub-system of the optical system of the exposure tool; and c) a parameter of scanning synchronization of the exposure tool.

5 Claims, 7 Drawing Sheets

110 Create matrix [Tdi]
- rows = sensors, columns = time points

120 Perform PCA to determine 32 orthogonal temperature vectors sorted in order of decreasing importance:
- [PC] = eigenvectors of $[Tdi][Tdi]^T$ (sorted by descending eigenvalue). *
- Any column of [Tdi] can be perfectly reconstructed using a linear combination of all 32 columns of [PC]

130 Choose the number of shapes "N" to use for the Temperature Basis Set [TBS].
- [TBS] = first "N" columns of [PC]
- These represent the N shapes that can reconstruct all columns of [Tdi] with the highest accuracy (for N shapes).

*Note: for some applications, PCA finds the eigenvectors of the covariance matrix, which involves removing the mean and dividing by (n-1) (n = 720 in this case). We do not remove the mean, and the n-1 factor does not affect the eigenvectors).

140 For each time point, calculate a vector $\{c_i\}$ containing the coefficients needed to reconstruct a column of [Tdi] from a linear combination of the columns of [TBS].
- $\{ci\} = [TBS]^+ * \{column\ of\ Tdi\}$
  - i.e. $\{column\ of\ Tdi\} = ci_1 PC_1 + ci_2 PC_2 + ...$
- To calculate all {ci} columns at once: $[Ci] = [TBS]^+ [Tdi]$ 150 Use the same coefficients that fit the temperature data to fit the orthogonality data:
- For every time point: $\theta i(t) \cong ci_1 \theta AIF_1 + ci_2 \theta AIF_2 + ...$
- $\{\theta AIF\} = [Ci^T]^+ \{\theta i\}$
  - Gives solution so that estimate of θ has the smallest error over all time points in the training data.
  - {θAIF} contains the orthogonality change associated with each temperature PC shape in [TBS].

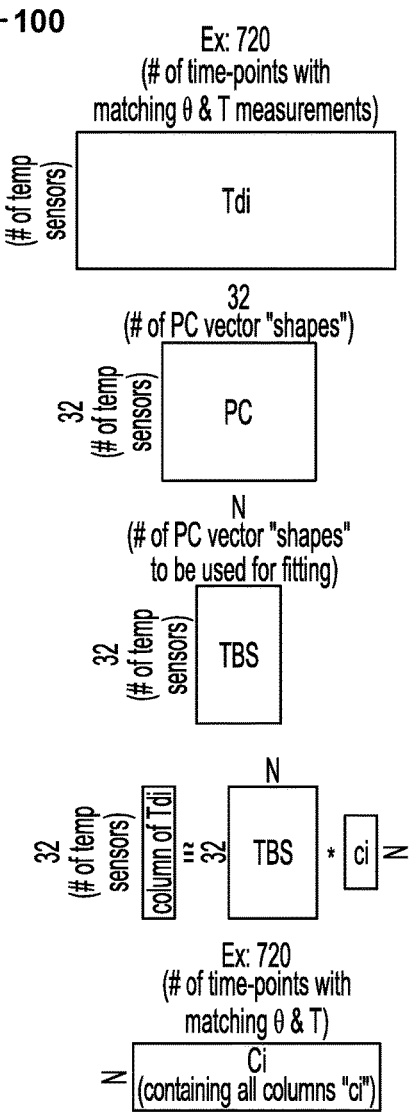

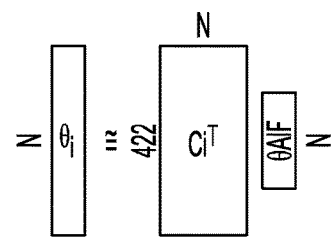

FIG. 1A

150 : Use the "ci" coefficients of each temperature shape in the data as independant variables for a linear regression fit:

- Compare to Linear Regression: y= A(x) + B
  150A
  − Independent variables: $x^1, x^0$
  − Coefficients: A, B $y \cong |x^1|x^0| * \genfrac{|}{|}{0pt}{}{A}{B}$

- Compare to Multivariable Linear Regression: z= Ax + By
  150B
  − Independent variables: x, y
  − Coefficients: A, B $z \cong |x|y| * \genfrac{|}{|}{0pt}{}{A}{B}$

- Our Calculation (for 2-shape fit): θi = A(ci1) + B(ci2)
  150C
  − Independent variables= ci1, ci2
  − Coefficients = A, B (same as θAIF$_1$, θAIF$_2$)

$\theta i \cong |ci1|ci2| * \genfrac{|}{|}{0pt}{}{A}{B}$

- The least-squares calculation is the same for all:
  150D
  − $\{{}^A_B\}$ = [Independent Vars]$^+${Dependent Var}
    > Where [Independent Vars] contains independent variable data in columns
    > Where {Dependent Var} contains corresponding dependent variable data

- In our case:
  − $\{{}^A_B\}$ is {θAIF}
  − [Independent Vars] is [Ci$^T$]
  − [Dependent Vars] is [θi]

- So: {θAIF} = [Ci$^T$]+{θi}

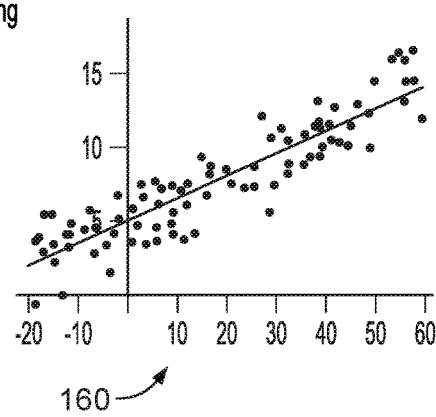

210 For a given time point "t", create a vector of all measured temperature values.
- To minimize noise, use the average of the last two minutes of temperature data.

220 For the same time point "t", calculate a vector {c(t)} containing the coefficients needed to reconstruct {T(t)} from a linear combination of the columns of [TBS]:
- $\{c(t)\} = [TBS]^+ * \{T(t)\}$
  - i.e. $\{T(t)\} = c(t)_1 PC_1 + c(t)_2 PC_2 + ...$ 230 Use the same coefficients that fit the measured temperature vector to estimate the orthogonality value:
- $\theta_{est}(t) = \{c(t)\}^T \{\theta AIF\}$
  - i.e. $\theta_{est}(t) = c(t)_1 \theta AIF_1 + c(t)_2 \theta AIF_2 + ...$

FIG. 2

LITHOGRAPHIC THERMAL DISTORTION COMPENSATION WITH THE USE OF MACHINE LEARNING

CROSS-REFERENCE TO RELATED APPLICATIONS

This applications claims priority from and benefit of U.S. Provisional Patent Application No. 62/476,278 filed on Mar. 24, 2017, the disclosure of which is incorporated herein by reference.

TECHNICAL FIELD

Various fabrication processes, including the process of forming an image on a target substrate with the use of a lithographic exposure tool, often utilize a moving stage to reposition a very large workpiece (such as an aluminum plate holder, for example). Heat loads from the exposure to image-forming radiation can and often does cause distortions of the elements and components of the exposure tool. To those distortions, heat radiated from the electronics of the exposure tool and the environment (which is not as stringently controlled as the radiation-cause heat) contributes yet additional distortions. Proper assessment of such distortions is required, especially in context of overlay errors that such distortion cause lead to during the process of multiple exposures of the target substrate during the lithographic process.

SUMMARY

Embodiments of the invention provide a method for operating a lithographic exposure tool. The method includes a step of exposing, through an optical projection sub-system of an optical system of the exposure tool, a workpiece disposed at a workpiece stage of the exposure tool to a dose of radiation to form a pre-determined image thereon; and a step of measuring (with a multiplicity of sensors, operably cooperated with at least one sub-system of the exposure tool) a first change in mutual orientation measuring a change in mutual orientation of first and second components of said at least one sub-system for a plurality of values of a parameter of said exposing, to produce first data representing the first change. The method further includes processing the first data with first electronic circuitry to estimate a second change in said mutual orientation, the second change caused by a supplementary value of said parameter. The method additionally includes a step of transforming the exposure tool to form a modified exposure tool by changing at least one of a) a geometrical path is a path along which the workpiece stage is repositioned during the operation of the exposure tool; b) one or more of a presence, position, orientation, size and shape of an optical component of an optical projection sub-system of the optical system of the exposure tool; and c) a parameter of scanning synchronization of the exposure tool. Additionally, the method includes exposing, through an optical projection sub-system of an optical system of the modified exposure tool, said workpiece to the dose of radiation.

Embodiments further provide a lithographic exposure tool, which comprises an optical system configured to expose a workpiece to a dose of radiation to form a predetermined image thereon, and a sensor system in operable cooperation with at least one sub-system of the exposure tool. Here, the sensor system is configured to measure data representing a first change in mutual orientation of first and second components of the sub-system for each of a plurality of values of a parameter of an exposure process. The exposure tool also includes a first electronic circuitry in operable communication with a tangible storage medium, the storage medium containing program code which, when run by the electronic circuitry, causes the electronic circuitry i) to estimate a second change in the mutual orientation for a supplementary value of the parameter based on data acquired from the sensor system and ii) to generate a value of estimated second change. The exposure tool also contains a second electronic circuitry configured (a) to modify the exposure tool, based on the value of the estimated change, by changing a geometrical path to from a modified exposure tool, and (b) to operate the modified exposure tool while having a value of a third change in the mutual orientation be smaller than the value of the estimated second change, the third change being a change in the mutual orientation measured with the sensor system during operation of the modified exposure tool. Here, the geometrical path is a path along which a movable stage of the exposure tool, carrying the workpiece during the operation of the exposure tool, is repositioned during the operation of the exposure tool.

BRIEF DESCRIPTION OF THE DRAWINGS

The invention will be more fully understood by referring to the following Detailed Description of Specific Embodiments in conjunction with the not-to scale Drawings, of which:

FIG. 1A describes the use of Training Data "i" to find TBS and θAIF;

FIG. 1B provides an alternative explanation to the use of Training Data;

FIG. 2 illustrates the used of the model created with the Training Data to Make a Prediction;

Figure 3:
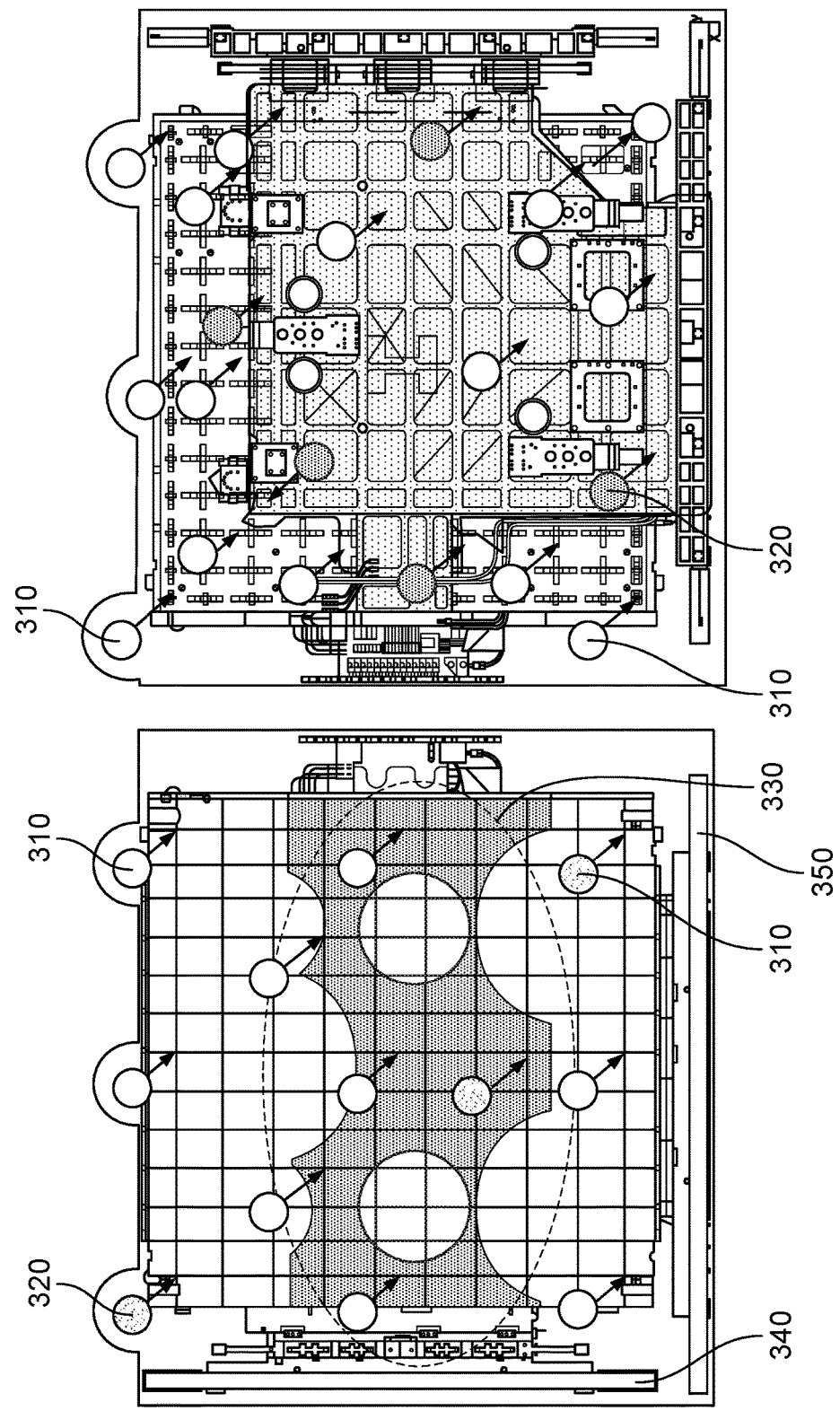
FIG. 3 provides an example demonstrating the reduction of a sensor pool from 32 potential sensors to 8 sensors.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

As was already alluded to above, heat loads from the exposure to image-forming radiation can and often do cause distortions of the elements and components of the exposure tool, which generate overlay errors and other errors affecting image-edge placement. (The subject of assessment and correction of image-edge placement was discussed, for example, in a co-pending U.S. patent application Ser. No. 15/014,677 and the International Patent Application PCT/US2015/048037, the disclosure of each of which is incorporated herein by reference.)

One example of deviations of the mutual positioning and/or orientation of the substrate from those prescribed by the design of the exposure process is provided by thermal distortions of long (about 1500 mm to about 3000 mm in length) mirrors, of the interferometer portion of the exposure tool, that are typically used to accurately position the stage. Under the influence of heat, both the orthogonality and the curvature(s) of the mirrors can change as a result of any of the following: a) temperature gradients in the mirrors themselves; b) temperature changes in the plate holder and stage; and c) temperature changes in the tool's supporting structures.

Modelling thermal distortions occurring in the exposure tool with the finite-element analysis (FEA) is known to be a rather involved task for several reasons:

The structural boundary conditions characterizing different exposure tools can be drastically different. Shims and actuators are used to flatten the plate holder, and the locations and preloads of these supports vary from tool to tool. Such variations lead to variations of the stiffness matrix and thermal paths of the structure and, potentially, to non-linear contact conditions that must be very carefully modelled to achieve a reliable degree of accuracy;

Air interactions with the large surface area of the large moving state, as well as convection in such stage geometrically-complex protruding structures of the state are extremely difficult to analyze, which leads to large uncertainties in setting thermal boundary conditions.

The temperature loads that must be modeled are often unknown. While initial analysis is often focused on heat loads caused only by exposure to radiation, empirical evidence demonstrates that heat loads from certain electronics and linear motors produce a very large effect as well, thereby requiring many cycles of modelling, experimentation, and result comparison leading to the following re-modelling may be necessary to achieve sufficient accuracy when using the FEA.

Additional empirical evidence proved that the calculated or otherwise assessed heat loads are often different at the site whether the exposure tool is eventually installed (a production facility), thereby further reducing the usefulness of the FEA model constructed with a series of model-experiment-compare-remodel cycles at an experimental facility.

The large plate holder often has to be custom adjusted to a specified flatness on each unit. These custom adjustments are different for each unit and involve shims and connections that change thermal and mechanical boundary conditions. In can be concluded, therefore, that no single FEA model exists that can be accurately applied to all units.

Related art employed various approaches to assessment of thermal distortions, among which there are:

a) Utilization of the FEA to choose locations for sensors on the target workpiece and to create relationships between temperature & distortion (used in CMM machine applications);

b) Prediction of the CNC tool's spindle distortion with the use of a neural network on the principle component weights of temperature sensors/gauges and strain gauges;

c) Utilization of temperature sensors along with "fuzzy clustering" to identify the primary heat loads, followed up by regression to relate variables to spindle distortions in the CNC machine tool; and d) Measurement of temperature in a support frame, optical element, or measuring system element in a lithography system, based on which the distortion is further calculated with the use of from a computer generated model of the element subject to such distortion (i.e., the use of the FEA), to name just a few. Unless expressly stated otherwise, and in the broadest used meaning of the term, a sensor (gauge) is a device, module, or subsystem (including electronic circuitry) the operational purpose is to detect events or changes in its environment and pass the information or data representing such events/changes to other electronics, frequently a programmable computer processor.

Despite the difficulties of modelling the distorted structure (target), the need to compensate for thermal distortions remains. Frequent measurement of the distortion in a production environment do not provide a practically-feasible solution to the problem of assessing the distortion because such measurements drastically reduce the production throughput. (Notably, however, measuring the distortion frequently for a period not substantially exceeding a single day during the set-up of the exposure tool may not be found impractical.)

It can be concluded, therefore, that methodologies addressed by related art that do not rely on the FEA are focused on CNC machine tools or CMM measurement machines, not lithography equipment. Heat loads for the CNC tool, as compared to those in the exposure tool, can fluctuate much more drastically, can be much less repeatable, and can cause much larger distortions on equipment that may be less rigorously designed for repeatability and linearity than the latter.

Lithography equipment, on the other hand, is both a more promising candidate for repeatable temperature-distortion relationships and a more financially justifiable application for the expense of experimentally training for those relationships. However, as has been already alluded to above, no single FEA model can be accurately applied to all exposure tools. Training the temperature-distortion relationship in the final machine configuration has the potential to be faster, cheaper, and more accurate than FEA-based approaches.

According to the idea of the invention, the problem of lithographic overlay errors, caused by complex distributions of thermal distortions of the interferometer mirrors at the surface where the image of the reticle is formed with the use of a lithographic exposure tool, is solved by:

Instrumenting the lithographic tool with high-accuracy low-cost temperature sensors, Completing a short, specific "training" sequence in which both temperature and distortion are periodically measured, Using machine learning methods to create a distortion prediction model, and, Thereafter, using only temperature measurements to predict and compensate for distortion errors during normal production operation.

Figure 6:
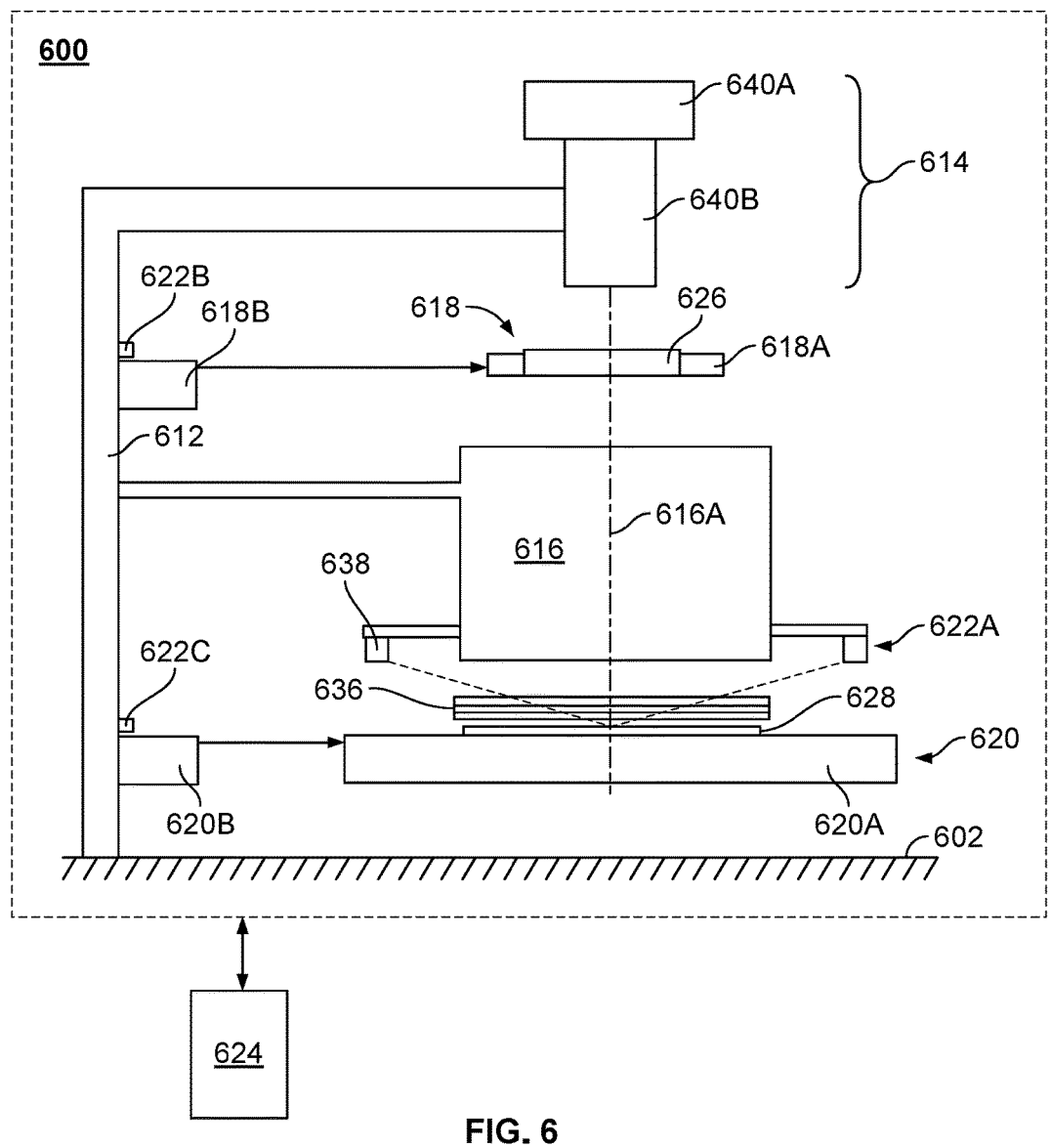
FIG. 6 is a diagram schematically illustrating a lithographic exposure apparatus.

To appreciate the context and operational environment in which an embodiment of the proposed idea may be used, a general description of a typical lithographic exposure apparatus may be useful. An example of the exposure apparatus (also interchangeably referred to as a lithographic apparatus), which may employ a conventional encoder head—the one equipped with individual corner cube retroreflectors—as well as, optionally, an autofocus system (AFS) for measurements of wafer displacements is provided in PCT/US2012/043186, the disclosure of which is incorporated herein by reference. FIG. 6 schematically illustrates, in reference to the provided Cartesian system of coordinates, a schematic non-limiting illustration of such exposure apparatus.

The exposure apparatus 600 includes an apparatus frame 612, an illumination system 614 (also referred to as irradiation apparatus), an optical assembly 616, a reticle stage assembly 618, a wafer stage assembly 620, a positioning system (shown as a combination of several units including systems 622A, 622B, 622C), and a control system 624. The control system is typically implemented to include required electronic circuitry and/or programmable processor which, when programmed with specifically design program code, is operable to govern the operation and performance of the exposure apparatus and peripheral devices and/or systems that such apparatus may be equipped with. The design of the components of the exposure apparatus 600 can be varied to suit specific requirements. The exposure apparatus 600 may be mounted to/on a mounting base 602, such as the ground, a base, or floor, or some other supporting structure.

Apparatus Frame.

The apparatus frame 612 is rigid and supports and/or houses at least the reticle stage assembly 618, the optical assembly 616, the wafer stage assembly 620, and the illumination system 614 above the mounting base 602.

Illumination System.

The illumination system 614 includes an illumination source 640A and an illumination optical assembly 640B. The illumination source 640A emits radiation to which the wafer/work-piece 628 is exposed and which is guided by the illumination optics of the assembly 640B to the optical assembly 616, along an optical axis 616A. On its way to the optical assembly 616, the beam of radiation illuminates a portion of the reticle 626 to gain spatial pattern of irradiation representing the pattern of the reticle 626.

The illumination source 640A can be, for example, any of a g-line source (436 nm), an i-line source (365 nm), a KrF excimer laser (248 nm), an ArF excimer laser (193 nm), a F2 laser (157 nm), or an EUV source (13.5 nm), or another preferred source of radiation. The wafer-illuminating (exposure) light may be provided at about 193 nm (by an ArF excimer laser system, for example) light (with a wavelength of 193 nm), but it can also include ultraviolet light such as described in, for example, U.S. Pat. No. 7,023,610. The source 640A of illuminating light may exploit harmonic frequency conversion or utilize an optical-fiber based amplifier, to produce radiation at a predetermined wavelength. Alternatively, the illumination source 640A can generate charged particle beams such as an x-ray or an electron beam. For instance, in the case where an electron beam is used, thermionic emission type lanthanum hexaboride (LaB6) or tantalum (Ta) can be used as a cathode for an electron gun. Furthermore, in the case where an electron beam is used, the structure could be such that either a mask is used or a pattern can be directly formed on a substrate without the use of a mask.

Optical Assembly.

The optical assembly 616 projects and/or focuses the light passing through the reticle 626 onto the work piece (wafer) 628. Depending upon the design of the exposure apparatus 600, the optical assembly 616 can scale (i.e., to magnify or reduce, with a specific coefficient) dimensions of the pattern of the reticle 626. In a specific implementation, the optical assembly 626 may simply optically relay the pattern of the reticle 626 onto the wafer (i.e., the optical assembly 626 may have a unit magnification, if desired).

Reticle Stage Assembly.

The reticle stage assembly 618 holds and positions, (with the use of a reticle stage mover assembly 618B) the reticle stage 618A that retains the reticle 626 relative to the optical assembly 616 and the wafer 628. The reticle stage mover assembly 618B can be designed to move the reticle stage 618A along any of the x, y, z axes.

Wafer Stage Assembly.

The wafer stage assembly 620 holds and positions (with the use of a wafer stage mover 620B) the wafer 628 with respect to the image of the illuminated portion of the reticle 626 projected onto the wafer. The wafer stage mover 620B can be designed to move the wafer 628 along any of the x, y, z axis. In one embodiment, the wafer 628 can be scanned while the wafer stage assembly 620 moves the wafer 628 along the y-axis.

Positioning System.

The positioning system (622A, 622B, 622C) monitors movement of the reticle 626 and the wafer 628 relative to the optical assembly 616 or some other reference. As shown in FIG. 6, the position system 622 includes (i) an AFS 622A that maps the topography of the wafer 628 relative to the optical assembly 616 along the Z axis (which is collinear with the optical axis 616A), about the X axis, and about the Y axis prior to exposure of the wafer with improved accuracy; (ii) a reticle measurement system 622B (only a portion of which is illustrated) that monitors the position of the reticle stage 618A and the reticle 626; and (iii) a wafer measurement system 622C (only a portion of which is illustrated) that monitors the position of the wafer stage 620A along the X and Y axes, and about the Z axis. Due to operation of the position system, the wafer stage assembly 620 can be controlled to position the wafer 628 with improved accuracy. The positioning system 622 can utilize laser interferometers, encoders, autofocus systems, and/or other measuring devices.

One implementation of the autofocus system 622A includes a reference system 636 configured to provide a reference signal used in conjunction with and related to the measurement of any changing operational parameter of the AFS 622A, but not the position of the wafer 628, along the optical axis 616A. The AFS 722A further includes a measurement system 738, which provides a measurement signal used in conjunction with and related to the measurement of anything changing in the AFS 622A including (the change of, if present) position of the wafer 628 along the optical axis 616A. By comparing the reference and measurement signals, the position of the wafer 628 is measured, which is accompanied with reduction of the stability requirements for many of the components of the AFS 622A.

A typical measurement system 638 may include an encoder assembly (not shown) that measures, in operation, the position of a work piece (as shown—the wafer 628). For example, in some embodiments, the encoder assembly can be designed to monitor and/or measure the position of the work piece along two axes (e.g., along the x- and y-axes). Additionally and/or alternatively, the encoder assembly can be designed to measure and/or monitor the position of the work piece 628 along all three axes (i.e., to specify the 3D position of the work piece 628).

The conventional measurement system 638 may also include a stage grating (not shown) that is secured to a side of the wafer stage 620A (of the assembly 620) that retains the work piece 628, and one or more fixed encoder heads (not shown). The number of encoder heads and their mutual positioning and orientation can be varied according to the design of the exposure apparatus 600 and/or the measurement system 638, and the amount of travel of the stage 620A along x- and y-axes. The use of multiple encoder heads enables the encoder assembly to more accurately measure the position of the stage 620A, and thus the position of the work piece 628 that is retained by the stage 620A. Examples of the structure(s) of the measurement system 638 and encoder head(s) are discussed in detail in U.S. 2014/0049762, which is incorporated herein by reference, and will not be addressed here additionally. Depending on the details of a particular implementation of the overall system, the encoder head may be provided on the wafer stage 620A and the grating may be provided on a fixed metrology frame.

Control System.

The control system 624 is operably connected to and governs the operation of at least the illumination system 614, the reticle stage assembly 618, the wafer stage assembly 620, and the positioning system 622. The control system 624 acquires measurement data, from the positioning system 622, that represent position and/or orientation and/or movement of the reticle 626 and/or wafer 628 with respect to the optical assembly 616 or another chosen reference. Based on these data, the control system 624 controls the assemblies 618, 620 to precisely position the reticle 626 and the wafer 628. The control system 624 can include one or more processors and electronic circuits, at least one of which may be specifically programmed to perform steps of data acquisition, data processing, and control of operation of the components of the apparatus 600.

Generally, the exposure apparatus 600 can be used as a scanning type photolithography system for optical transfer of a spatial pattern from the reticle 626 onto the wafer 628, with the reticle 626 and the wafer 628 moving synchronously. Alternatively, the exposure apparatus 620 can be used as a step-and-repeat type photolithography system that exposes the reticle 626 while the reticle 626 and the wafer 628 are stationary. The use of the exposure apparatus 600, however, is not limited to a photolithography system for semiconductor manufacturing and can include, as a non-limiting example, the use as an LCD photolithography system that projects a liquid crystal display device pattern onto a rectangular glass plate or a photolithography system for manufacturing of a thin film magnetic head.

In particular, one embodiment of the invention, provides methodology for using machine learning techniques and a specifically-chosen time period (such as, for example, a 24-hour period, or a single day period) of "training" to reliably determine the temperature-distortion relationship for a lithographic tool. The particular conditions needed for training, the robustness of training with different data sets, and the accuracy of the prediction on about 5 weeks of experimental data spread across nine months have been extensively analyzed and verified.

The methodology includes the following steps:

Equipping the subject lithography tool with high-precision temperature sensors (in one specific case—with a predetermined number of sensors);

Upon installing the tool at a customer site, spending the allocated amount of time (for example, 24 hours) "training" the tool (under the training conditions described below) by imparting heat loads to the target, recording temperatures to which the target is subject as a result of the applied heat load, and periodically recording the target distortion (in one example—recording changes in mutual orthogonality of interferometer mirrors of the lithographic tool by measuring a signal output associates with the reference plate).

Using a form of principle component regression to find the predetermined number (in one example—six) functional distributions of temperature that are most present in the experimental data (phrased differently, experimentally determining thermal eigenmodes associated with the target), as well as influences of these functional distributions on target distortion. This operation, configured as a completely automated machine learning operation performed with (an optionally dedicated electronic circuitry, which may be configured as a stand-alone circuitry or as a portion of the control system 624 of the tool 600), produces (is used to create) a prediction model for subsequent operation of the tool (machine).

Operating the tool (machine) in a production environment, while carrying out the following steps before every exposure of the target:

a) Checking the temperature, T, of the target (by, for example, measuring the temperature);

b) Using the prediction model to estimate the current, instantaneous distortion(s) of the target (such as, for example, the error of or a deviation from the ideal mutually-orthogonal disposition of the interferometer mirrors).

c) Compensate for such instantaneous distortion(s) by modifying, based on estimated distortions of the target, the exposure tool by changing at least one of i) one or more of a presence, position, orientation of an optical component of the optical projection system of the exposure tool; ii) a parameter of scanning synchronization of the exposure tool, and iii) transforming the operation of stage-positioners and/or drivers to adjust the spatial trajectory along which the repositioning and/or movement of the stage of the exposure tool occurs during the operation (e.g. by accounting for the orthogonality error when re-positioning the stage) to reduce the value(s) of distortion of the target occurring during the exposure as compared with the estimated values. Item i), that is adjustments to the projector of the exposure too, effectuated according to the idea of the present invention include a change of a setup parameter of the exposure tool (such as, for example, optical axis tilt, distribution of illumination in a principal plane of the exposure tool, polarization status in a principal plane of the projection system, illuminator flare, numerical aperture of the projection lens, projection lens aberrations, shape of the pupil of the projection lens, optical apodization, optical transmission and flare of the projection lens). Item iii) may include changing a pre-determined spatial path of the target-carrying stage of the exposure tool to a different path by modifying at least one of the sequence of operation and amplitude of incremental movements imparted on the stage by the stage repositioners.

Example 1: Non-Limiting Example of Training Conditions

X1 hours of exposure at the highest dose expected in the production environment (e.g., at 100 mJ/cm$^2$ per dose) in order to train the system for maximum temperature swings and gradients. In one implementation X1=12.

X2 hours of keeping the machine stationary at the "home" (zero, steady-state) position to train the system for heat loads that are unique to "cold-start" conditions, which traditionally cause particularly high and unpredictable mirror distortions. In one implementation, X2=8.

X3 hours of running the machine as if it were being exposed, but without applying the exposure lamp, to implement training for the environment corresponding to rapidly cooling conditions). In one implementation, X3=4.

During the process of training, distortions of the target should be measured as often as possible without significantly disturbing the desired heat loads (in one example, every 2 minutes during exposure/running conditions; and every 2 hours during stationary conditions).

Example 2: An Example of the Principle Component Regression Algorithm (PCA) of the Present Methodology is Illustrated in FIGS. 1A, 1B, and 2

FIG. 1A describes the use of Training Data (represented by a running sub-index "i") to determine TBS and θAIF in the process 100. Here, at step 120, the PCA is carried out to determine a defined number M (as shown, M=32) temperature vectors (orthogonal to one another and representing temperature readings procured with the use of M temperature sensors thermally associated/coupled with the exposure tool) that are sorted in order of decreasing importance. As a result of carrying out step 120, the programmable processor of the system produces a report containing a matrix PC, populated with characteristics or "shapes" of the temperature vectors for each of the temperature sensors. The PCA is effectuated with the of a matrix Tdi, formed at step 110 to contain the readings from matching θ and T measurements performed at i time moments (in one example, 1=720) by the temperature sensors associated with the target. At step 130, a certain number N of "shapes" of the temperature vectors is chosen for further use, to identify the M-by-N matrix TBS. Due to the nature of sorting the temperature vectors to populate the PC matrix at step 120, the TBS matrix includes, essentially, the first N columns of the PC matrix, which columns represent the temperature vectors that can be used to reconstruct all columns of the Tdi matrix with the highest available accuracy. At step 140, for each time point i a corresponding N-by-1 vector $c_i$ is calculated, which contains the coefficients required to reconstruct an i-th columns of the Tdi matrix from the linear combination of the columns of the TBS matrix. The vector representing a given reconstructed (as a product of the TBS matrix and the $c_i$ vector) i-th column of Tdi has a dimension of M-by-1. A matrix $C_i$ then can be formed as a summation of the TBS and Tdi matrices to contain, as its i columns, the individual $c_i$ vectors.

At step 150 of the process, the same coefficients that fit the temperature data are used to fit the orthogonality data. Here, since for every time-point "i", the characteristic $\theta_i$ is substantially represented by a product of the transposed $C_i$ and the θAIF, the θAIF characteristic can be appropriately determined to represent a solution in which the orthogonality parameter θ has the smallest error over all i time points of the training data. The θAIF characteristic represents the change of the initial shape and/or orientation of the target (that is, the distortion of the target, such as a change of mutual orthogonality of the interferometer mirrors of the exposure tool) associated with each of the temperature vectors PCT in the TBS matrix. The details of the step 150 of the current process are additionally presented in FIG. 1B using the generalized example of 1D-vectors y and z, a matrix $$\begin{bmatrix} A \\ B \end{bmatrix}$$

representing the θAIF characteristic, and a two-column matrix representing a specific 2-temperature vector fit. As shown, the $c_i$ coefficients for each temperature shape (temperature vector) are used in the data as independent variable for a linear regression fit, and include at least one of the operations of comparison to linear regression (150A), comparison to multivariable linear regression, the calculation of $\theta_i$ (150C), and the least-squares fit (150D). As a result of the process 100, the system generates a report containing the linear regression fit represented by curve 160 and the parameters of such fit.

FIG. 2 schematically illustrates the use of the model for θAIF, created in the process 100 with the Training Data, to Make a Prediction in a given practical situation. Here, at step 210, a data vector T(t) populated with all empirically measured, with M temperature sensors, values of temperature (of the target) is formed for a given moment of time t. At step 220, for the same time point t, a vector c(t) containing coefficient requires to reconstruct the vector T(t) from a linear combination of the matrix TBS is determined. At step 230, the same coefficients that are used to fit the measured temperature vector are used to estimate the value $\theta_{est}(t)$ of the distortion of the target (in one example—the figure-of-merit characterizing the mutual orthogonality of the interferometric mirrors).

Example 3

Another feature of an embodiment of the invention turns on choosing locations for sensors that are most appropriate for capturing the necessary information about the sought-after distortion. The process of choosing the sensor-positioning location includes the following steps:

Step 1:

Estimation of sensor positions that will lead the desired distortion and sensor positions that will lag the desired distortion (i.e., sensor positions that will change in temperature before and after the associated distortion, similar to a phase lead or lag). In one implementation, such estimations are performed by a) Creating an approximate transient thermal FEA model of the primary structures in the tool and perform analysis with the supposed dominant heat load. The magnitude of distortion caused by the heat load and the complete accuracy of thermal boundary conditions is not crucial, but should be approximated as correctly as possible.

b) Simulating a pulse in the primary heat load with appropriate length (for an exposure heat load, for example, one could simulate exposure heat load on for three hours, then off for three hours).

c) Recording the history of temperatures at all locations in the model, as well as the history of the distortion.

d) Normalizing temperature and distortion responses to determine which locations in the model reach maximum temperature before distortion reaches its maximum (these are "leading" locations) and which locations in the model reach maximum temperature after distortion reaches its maximum (these are "lagging" locations).

Step 2:

Before installing the tool at the customer site, performing pre-training experiments with a larger number of sensors than is desired in the final application. Place approximately equal amounts of these sensors in leading and lagging locations. Perform "practice" training intervals to obtain both training and test data. Using performance on test data as a metric, use any of the well-known "greedy" reduction algorithms to reduce the pool of sensors to the desired number with the least effect on prediction performance.

It is appreciated that the use of excessive number of sensors acquiring data used for determination of the distortion of the target is not operably justified. Accordingly, the not only the number but also positions for situating the optimized number of sensor has to be addressed. FIG. 3, showing side-by-side the two views of a given portion of the exposure tool, provides an example demonstrating the choice-driven reduction of a sensor pool from 32 potentially-used sensors attached to the given portion of the tool (as shown both in empty circles 310 and darkened circles 320) to only 8 sensors (shown only by darkened circles 320). Original sensor placement (310, 320) guided by rough FEA, with some sensors in leading and some in lagging locations (heavily leading regions are schematically and very approximately outlined with a curve 330). This approach both reduces the cost of the optimized embodiment of the invention and leads to improved prediction performance.

Figure 4:
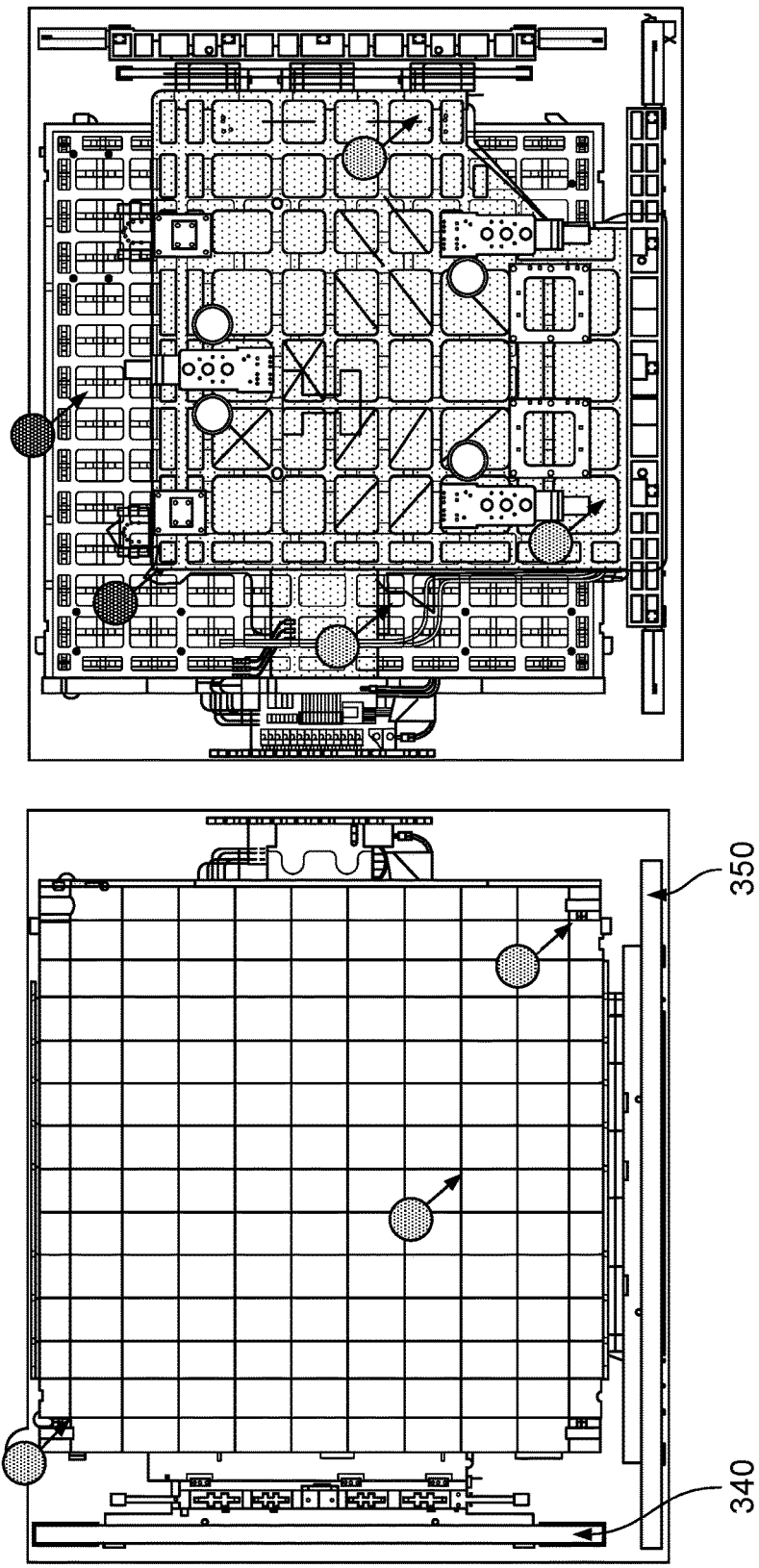
FIG. 4 presents a generalized schematic with indication of the locations for the temperature sensors in reference to interferometer mirrors of the exposure tool (which mirrors are subject to heat-caused distortions during the process of exposure of the target substrate)

In a specific example of the implementation of the idea of the invention, eight temperature sensors were used with a chosen lithography tool to successfully predict and compensate for changes in the orthogonality of two interferometer mirrors of the lithography tool. The locations at which these temperature sensors were positioned at the tool (in reference to interferometer mirrors 340, 350 that are subject to heat-caused distortions) are indicated in FIG. 4 with circles and pointing arrows.

Example 4

Related embodiments of the invention may include: the use of alternative (principle component) distortion functions to predict/compensate, on a chosen lithography machine: (i) Interferometer mirror curvature; (ii) BVU calibration distortion; (iii) Lens calibration distortion; (iv) Lens shift & distortion/lens barrel distortion Notably, substantially any undesirable distortion of a target that might be caused by or influenced by temperature in a way that is difficult to model theoretically, such as,
—Interferometer mirror distortions, lens distortions, stage distortions, wafer holder/plate holder distortions, guide rail distortions, sensor mount distortions, substrate distortions, or any other distortions that cause positioning errors or other undesirable effects—
could be an appropriate candidate for prediction and compensation using or this technique.

The disclosed technique could be used, additionally or in the alternative, to predict and compensate for other effects in an exposure tool machine (apart from distortion), such as, for example,
Air temperature/index of refraction change between interferometers and interferometer mirrors.
Potential for/extent of slip in a substrate chuck.
Changes in motor efficiency or performance.
Required flow rate or required duty cycle in a temperature control system.
Potential for machine malfunctions, errors, or performance degradation.
Need for machine maintenance.
Auxiliary sensors (instead of or in combination with temperature sensors) could also be employed to carry out the proposed methodology, such as
Strain gauge sensors.
Heat flux sensors.
Displacement sensors (capacitive sensors, eddy current sensors, interferometers, etc.).
Temperature sensors not mounted to the physical machine (air temperature sensors, for example).

Other features not traditionally referred to as "sensors" could also potentially be used to implement the idea of the invention. For example, the sub-systems configured in a form of at least one of hardware and software components and providing the following information inputs into the system could be used to help predict a sought-after target value:
Current machine dose or operating conditions.
Time of day, week, or year.
Time elapsed since a predetermined event (time since machine was last stationary, time since dose changed, time since person entered the machine, etc.).
Type of substrate/layer of substrate/customer for substrate
Data from other calibrations (e.g. lens shift calibration values, mirror curvature calibration values, etc.)

In one implementation, the PCR with six principle components is preferably used as a machine learning method for the application of interest (because of noise rejection properties, generalizability, and robustness of this approach). Other machine learning techniques can be employed instead, such as, for example:
Partial Least Squares regression
Neural networks
Multivariate regression
Time series multivariate regression
Regression using numerical derivatives and exponential functions of temperature
Principle component regression using multiple models for various tool conditions
These or other machine learning or statistical methods could also be used to create temperature-distortion relationships (or other sensor-target prediction relationships).

While in this application it is intended that a separate prediction model be trained for each customer's machine, for other applications or other types of lithography tools it is possible that a single model can be trained on a single unit and then used on multiple units.

Example 5

Figure 5:
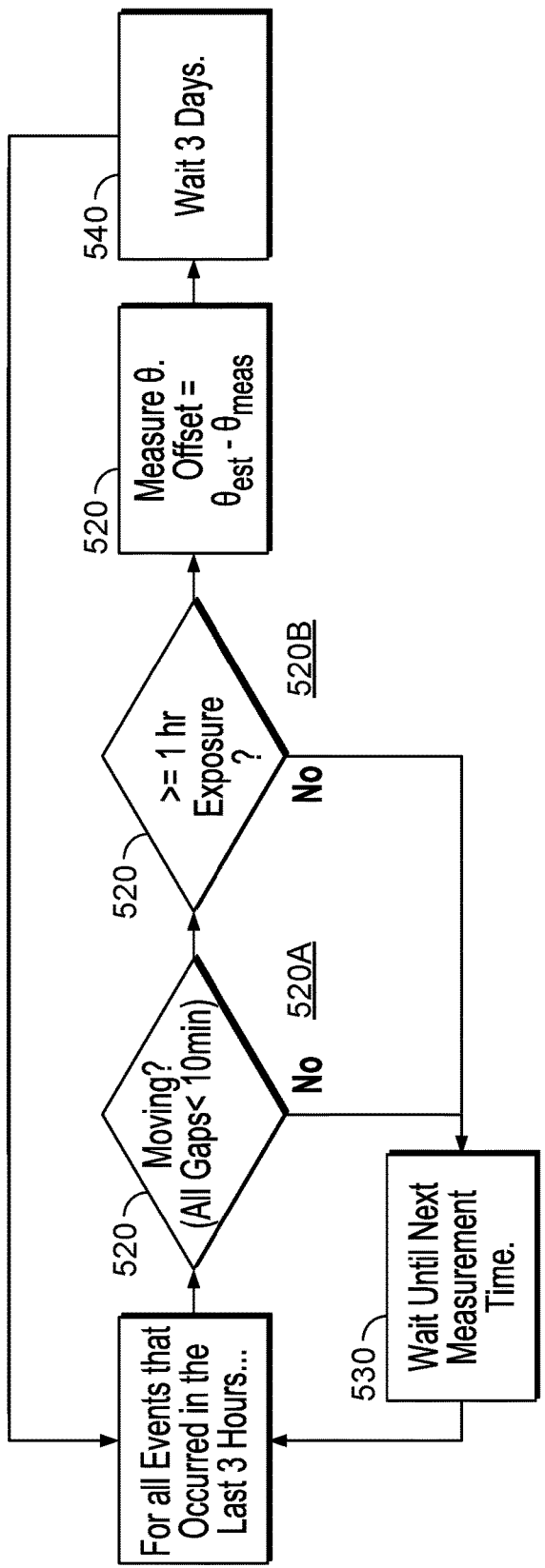
FIG. 5 provides an example of the algorithm modality configured to facilitate the choice/definition of time that is appropriate for correction of the slow drift offset.

Another feature of an implementation of the idea of the invention involves removing or compensation for slow (as compared with those occurring on the time-scale of heating caused by the exposure process) drifts or changes in the positioning (and/or orientation) of the target (such as, for example, slow changes in mutual orthogonality of the interferometric mirrors of the lithography tool, occurring either due to non-thermal factors or due to thermal factors that cannot be measured in a short time period comparable to time-period associated with individual exposures of the target). These slow drifts can be accounted for and compensated (removed) in the lithography tool with the use of periodic (with a period of K hours, for example) calibration (i.e. using a single orthogonality measurement every L days, which does not significantly affect customer throughput). An algorithm can be used to appropriately choose a good time to correct the slow drift offset. An example of methodology configured to facilitate the choice of time appropriate for correction/compensation of the slow drift offset, introduced to the lithography tool in operation, is shown in FIG. 5, and includes:
at step 520, on a scale of K hours (as shown, K=3), the measurement of the changes in a position/orientation (that is, a geometrical distortion) of the target are measures to determine the geometrical offset parameter as a difference between the parameter estimated at step 230 and that measured at step 520. Examples of operational conditions for performing such measurement are provided in 520A, 520B. When at least some of the operational pre-requisites for performing the measurement are not satisfied (shown as NO) the measurement at 520 is not performed and, instead, the no-action is taken at 530;

at 530, do not perform the next measurement of such changes until the waiting (grace) period of L days (as shown, L=3) has lapsed, then repeat the measurement.

It is appreciated, therefore, the implementation of the present invention facilitates a decrease of lithographic overlay errors caused by thermal distortions while not requiring:

Requiring months of iterative FEA & experimentation, which may or may not be accurate with different thermal & assembly conditions at a customer site.

Decrease in production throughput by requiring distortion to be physically measured and calibrated (exe with a reference plate) during production.

Drastic decrease of orthogonality errors in a chosen tool.

Notably, related art does not utilize the proposed technique for finding temperature-distortion relationships using a regression of the temperature distributions experimentally found to be most present (prevalent) in the empirically-acquired data. The proposed methodology is particularly suited to complex, high-resolution lithography applications, where small amounts of temperature sensor noise could cause serious problems if not handled correctly.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description.

The operation of embodiments of the invention may include—even if not expressly shown in the accompanying drawings—a specifically-programmed computer-readable processor controlled by instructions stored in a tangible, non-transitory storage memory. Such processor may be appropriately programmed to govern the operation of the embodiment and/or collect data acquired during such operation, in order to extract and process information pertaining to a given measurement conducted during the operation of the embodiment. The memory may be random access memory (RAM), read-only memory (ROM), flash memory or any other memory, or combination thereof, suitable for storing control software or other instructions and data. Instruction information may be conveyed to a processor through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

Disclosed aspects, or portions of these aspects, may be combined or modified in ways not listed above. Accordingly, the invention should not be viewed as being limited to the disclosed embodiment(s).

The invention claimed is:

1. A lithographic exposure tool, comprising
   an optical system configured to expose a workpiece to a dose of radiation to form a predetermined image thereon;
   a sensor system in operable cooperation with at least one sub-system of the exposure tool, said sensor system configured to measure data representing a first change in a mutual orientation of first and second components of said sub-system for each of a plurality of values of a parameter of an exposure process;
   a first electronic circuitry in operable communication with a tangible storage medium, the storage medium containing program code which, when run by the electronic circuitry, causes the electronic circuitry
      to estimate a second change in the mutual orientation for a supplementary value of the parameter based on data acquired from the sensor system and to generate a value of the estimated second change;
   and
   a second electronic circuitry configured
      to modify a configuration of the exposure tool, based on said value of the estimated second change, by changing a geometrical path to form a modified exposure tool, and
      to operate the modified exposure tool while having a value of a third change in the mutual orientation smaller than the value of the estimated second change, the third change being a change in the mutual orientation measured with the sensor system during operation of the modified exposure tool, wherein the geometrical path is a path along which a movable stage of said exposure tool, carrying the workpiece during the operation of the exposure tool, is repositioned during the operation of the exposure tool.

2. A lithographic exposure tool according to claim 1, wherein said first and second components include mirrors of an optical interferometer portion of the exposure tool, and said second change represents a change of a mutually-orthogonal positioning of said mirrors.

3. A lithographic exposure tool according to claim 1, wherein the supplementary value is not part of said plurality of values.

4. A lithographic exposure tool according to claim 1, wherein said program code includes program code for operating the exposure tool according to a schedule of said exposure process at the highest value of said dose occurring in a production environment for a first duration of time;

program code for keeping the exposure tool in a stationary mode without movement present between components of the exposure tool for a second duration of time; and program code for operating the exposure tool according to the schedule at a zero exposure dose for a third duration of time.

5. A lithographic exposure tool according to claim 1, wherein said second electronic circuitry is configured to compensate for said second change by changing at least one of a) one or more of a presence, position, orientation, size and shape of an optical component of an optical projection sub-system of the optical system of the exposure tool, and b) a parameter of scanning synchronization of the exposure tool.

* * * * *